(12) United States Patent
Lee et al.

(10) Patent No.: US 10,845,385 B2
(45) Date of Patent: *Nov. 24, 2020

(54) PROBE CARD DEVICE

(71) Applicant: CHUNGHWA PRECISION TEST TECH. CO., LTD., Taoyuan (TW)

(72) Inventors: Wen-Tsung Lee, New Taipei (TW); Kai-Chieh Hsieh, Taoyuan (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 71 days.

This patent is subject to a terminal disclaimer.

(21) Appl. No.: 16/381,624

(22) Filed: Apr. 11, 2019

(65) Prior Publication Data

US 2019/0377003 A1 Dec. 12, 2019

(30) Foreign Application Priority Data

Jun. 6, 2018 (TW) .............................. 107119478 A

(51) Int. Cl.
*G01R 1/073* (2006.01)
*G01R 1/067* (2006.01)

(52) U.S. Cl.
CPC ..... *G01R 1/07342* (2013.01); *G01R 1/06716* (2013.01); *G01R 1/07364* (2013.01)

(58) Field of Classification Search
CPC ............ G01R 1/07342; G01R 1/06716; G01R 1/07364
USPC ...................................... 624/756.03
See application file for complete search history.

(56) References Cited

U.S. PATENT DOCUMENTS

| 6,676,438 B2* | 1/2004 | Zhou | G01R 1/06711 324/756.03 |
|---|---|---|---|
| 2019/0377004 A1* | 12/2019 | Lee | G01R 1/07364 |

* cited by examiner

*Primary Examiner* — Christopher E Mahoney
(74) *Attorney, Agent, or Firm* — Li & Cai Intellectual Propeny (USA) Office

(57) ABSTRACT

A probe card device is provided, and includes a plurality of conductive probes and a flat signal transfer structure that includes a transfer plate and a retaining cover. The transfer plate has a first surface and a second surface that is opposite to the first surface. The transfer plate includes a receiving slot recessed from the first surface and a plurality of signal circuits each having a signal contact arranged at a bottom of the receiving slot. A portion of the transfer plate arranged around and adjacent to the receiving slot is defined as a supporting portion. The retaining cover has a plurality of thru-holes and is disposed on the supporting portion. The retaining cover and the receiving slot of the transfer plate jointly and surroundingly define a receiving space, and the signal contacts of the transfer plate are arranged in the receiving space.

6 Claims, 8 Drawing Sheets

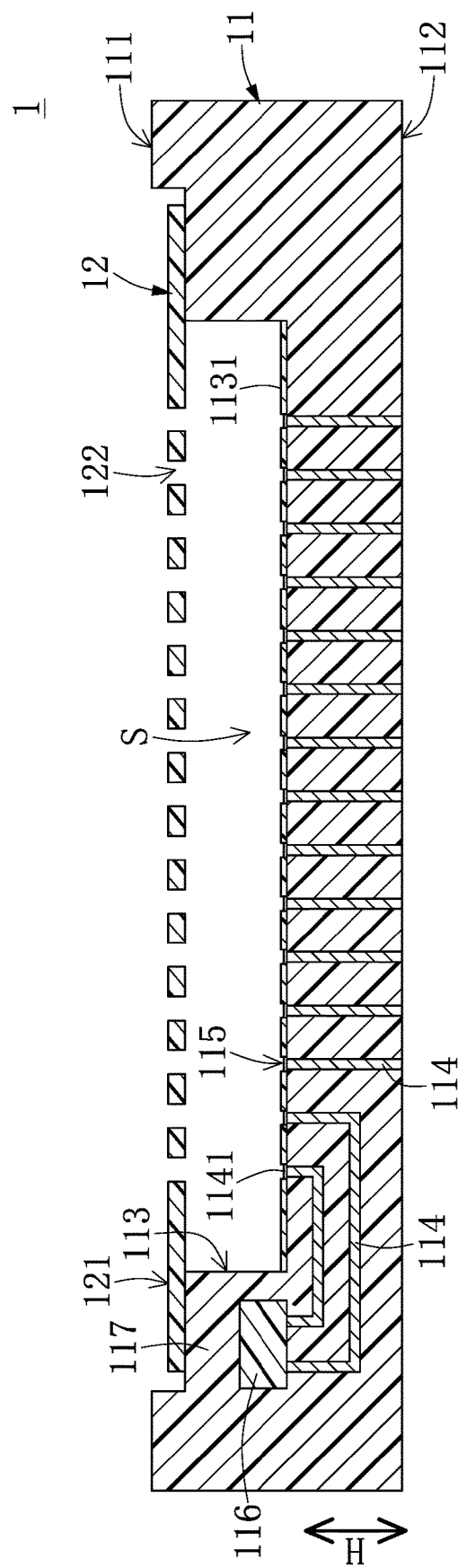
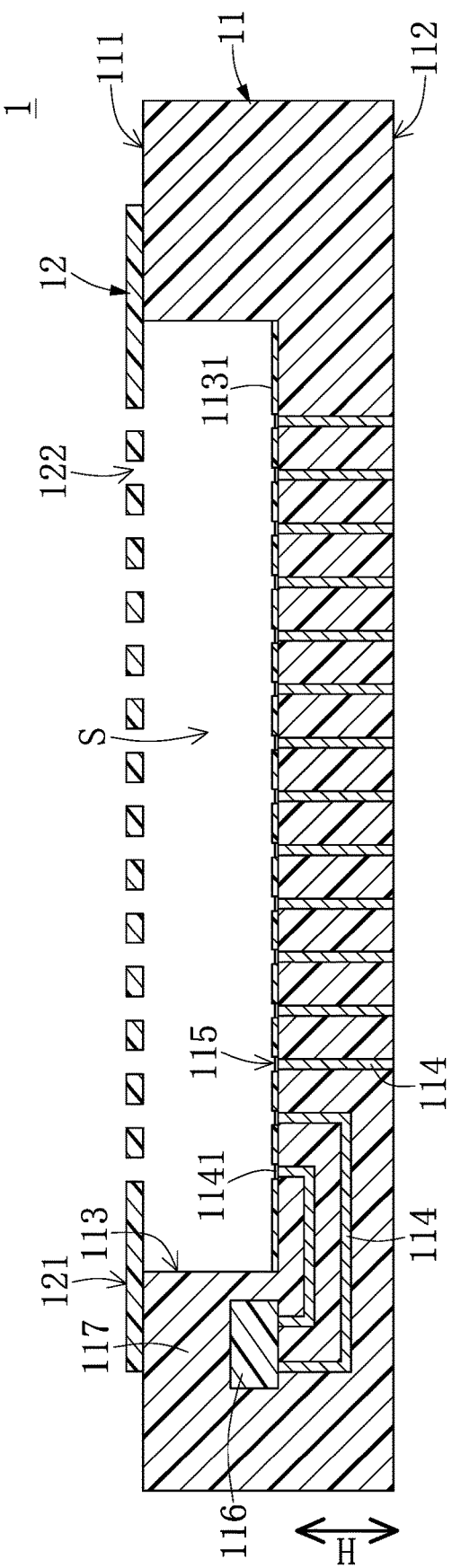
FIG. 1B
FIG. 1C

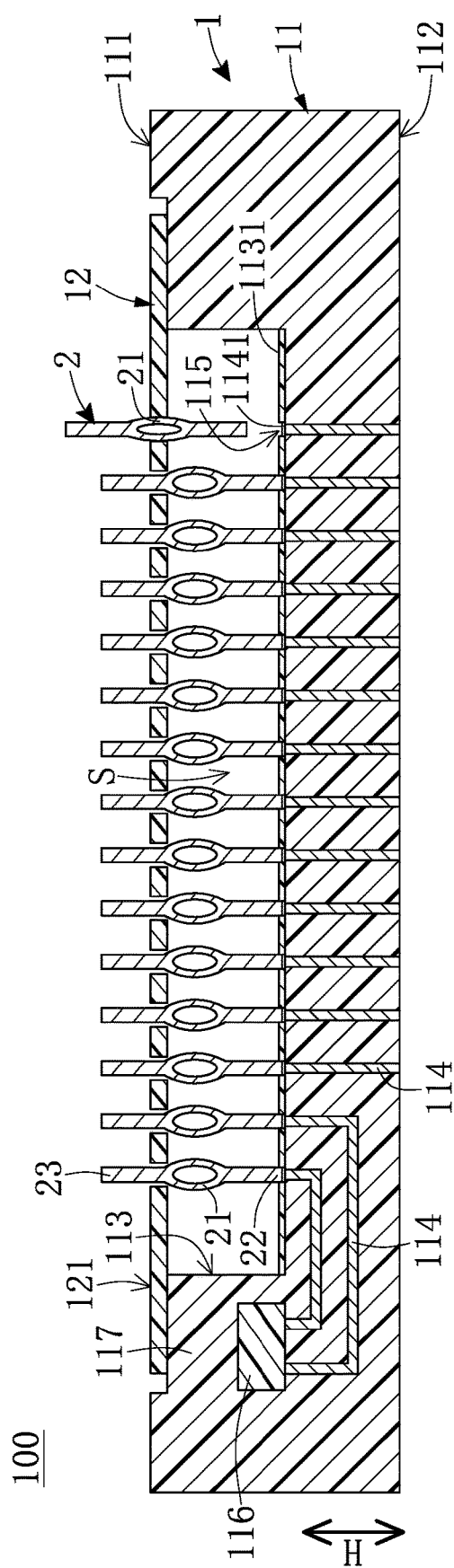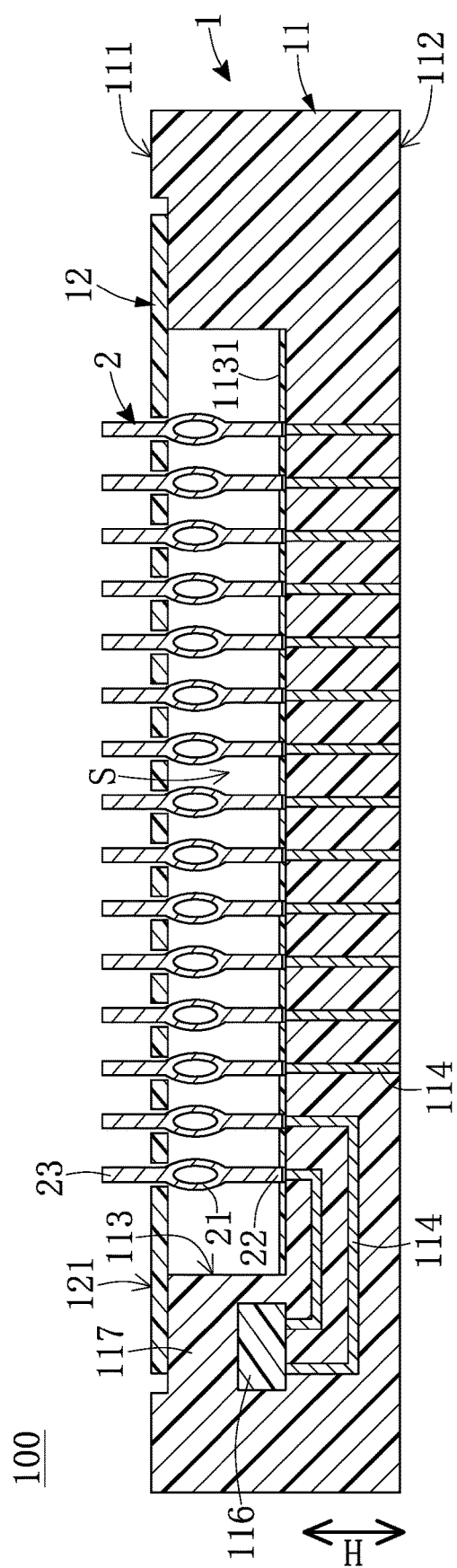
FIG. 8
FIG. 9

PROBE CARD DEVICE

CROSS-REFERENCE TO RELATED PATENT APPLICATION

This application claims the benefit of priority to Taiwan Patent Application No. 107119478, filed on Jun. 6, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a probe card device and a flat signal transfer structure thereof.

BACKGROUND OF THE DISCLOSURE

A conventional probe card includes a probe retainer, a plurality of probes passing through and positioned with the probe retainer, and a transfer plate spaced apart from the probe retainer and connected to the probes. The probe retainer of the conventional probe card includes an upper die, a lower die, and a spacer that is sandwiched between the first die and the second die. Two opposite ends of each of the probes respectively protrude from the upper die and the lower die of the probe retainer, so that one of the two opposite ends of each of the probes is connected to the transfer plate, and the other end of each of the probes is configured to detect an object (e.g., a semi-conductor wafer).

However, the above configuration of the conventional probe card has been in existence for many years, and research on the probe card by those skilled in the art has not been able to break away from the conventional configuration, so that development of the conventional probe card has been from achieving significant progress.

SUMMARY OF THE DISCLOSURE

In response to the above-referenced technical inadequacies, the present disclosure provides a probe card device and a flat signal transfer structure thereof to effectively improve the issues associated with conventional probe cards.

In one aspect, the present disclosure provides a probe card device, which includes a flat signal transfer structure and a plurality of conductive probes. The flat signal transfer structure includes a transfer plate and a retaining cover. The transfer plate has a first surface and a second surface that is opposite to the first surface. The transfer plate includes a receiving slot recessed from the first surface and a plurality of signal circuits each having a signal contact arranged on a bottom of the receiving slot. A portion of the transfer plate arranged around and adjacent to the receiving slot is defined as a supporting portion. The retaining cover has a plurality of thru-holes and is disposed on the supporting portion. The retaining cover and the receiving slot of the transfer plate jointly and surroundingly define a receiving space. The conductive probes each have an elastic segment, a detecting segment, and a connecting segment, the latter two of which are respectively arranged at two opposite sides of the elastic segment. The conductive probes respectively pass though the thru-holes of the retaining cover, the elastic segment and the connecting segment of each of the conductive probes are arranged in the receiving space, and the detecting segment of each of the conductive probes is exposed out of the receiving space and protrudes from the first surface. The connecting segments of the conductive probes are respectively fixed on the signal contacts of the transfer plate.

In one aspect, the present disclosure provides a flat signal transfer structure of a probe card device. The flat signal transfer structure includes a transfer plate and a retaining cover. The transfer plate has a first surface and a second surface that is opposite to the first surface. The transfer plate includes a receiving slot recessed from the first surface and a plurality of signal circuits each having a signal contact arranged on a bottom of the receiving slot. A portion of the transfer plate arranged around and adjacent to the receiving slot is defined as a supporting portion. The retaining cover has a plurality of thru-holes and is disposed on the supporting portion. The retaining cover and the receiving slot of the transfer plate jointly and surroundingly define a receiving space, and the signal contacts of the transfer plate are arranged in the receiving space.

Therefore, the flat signal transfer structure of the probe card device in the present disclosure has only one retaining cover, and is different from conventional probe cards in that no spacers are used, thereby effectively reducing cost of the probe card device (e.g., by simplifying the structure and the assembling process of the probe card device) and providing a new direction for development. Moreover, the flat signal transfer structure of the probe card device can cooperate with shorter conductive probes, so that the probe card device can be used to transmit signals of higher frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which:

FIG. 1B is a schematic view of the flat signal transfer structure according to the first embodiment of the present disclosure in another configuration.

FIG. 1C is a schematic view of the flat signal transfer structure according to the first embodiment of the present disclosure in further another configuration.

FIG. 8 is a schematic view showing the flat signal transfer structure to be inserted with the probes according to the second embodiment of the present disclosure.

FIG. 9 is a schematic view of a probe card device according to the second embodiment of the present disclosure.

DETAILED DESCRIPTION OF THE EXEMPLARY EMBODIMENTS

Figure 1A:
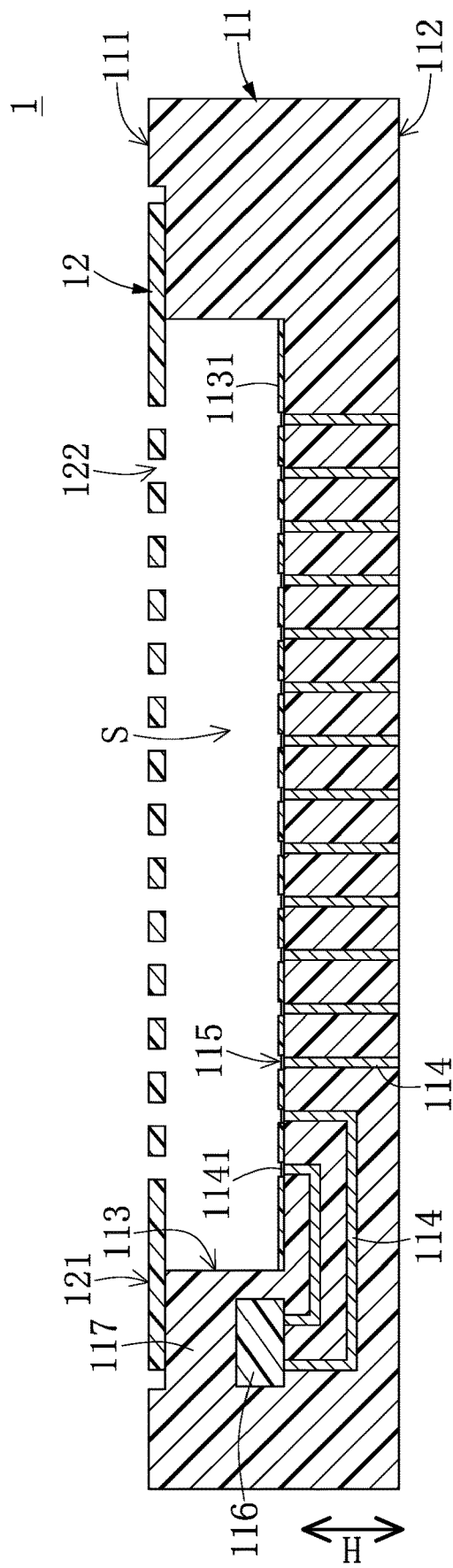
FIG. 1A is a schematic view of a flat signal transfer structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1A to FIG. 6, a first embodiment of the present disclosure provides a probe card device 100 used for detecting an object 200 (e.g., a semi-conductor wafer). The probe card device 100 includes a flat signal transfer structure 1 and a plurality of conductive probes 2 inserted into the flat signal transfer structure 1. The flat signal transfer structure 1 in the present embodiment cooperates with the conductive probes 2, but the present disclosure is not limited thereto. For example, in other embodiments of the present disclosure, the flat signal transfer structure 1 can be independently sold.

As shown in FIG. 1A, the flat signal transfer structure 1 includes a transfer plate 11 and a retaining cover 12 disposed on the transfer plate 11. It should be noted that the flat signal transfer structure 1 in the present embodiment is similar to a flat circuit board. In other words, the flat signal transfer structure 1 is different from a non-flat signal transfer structure (with, e.g., at least 50% of any conductive probe 2 being arranged outside of a transfer plate of a signal transfer structure). The following description discloses the structure and connection relationships of each component of the flat signal transfer structure 1.

Figure 2:
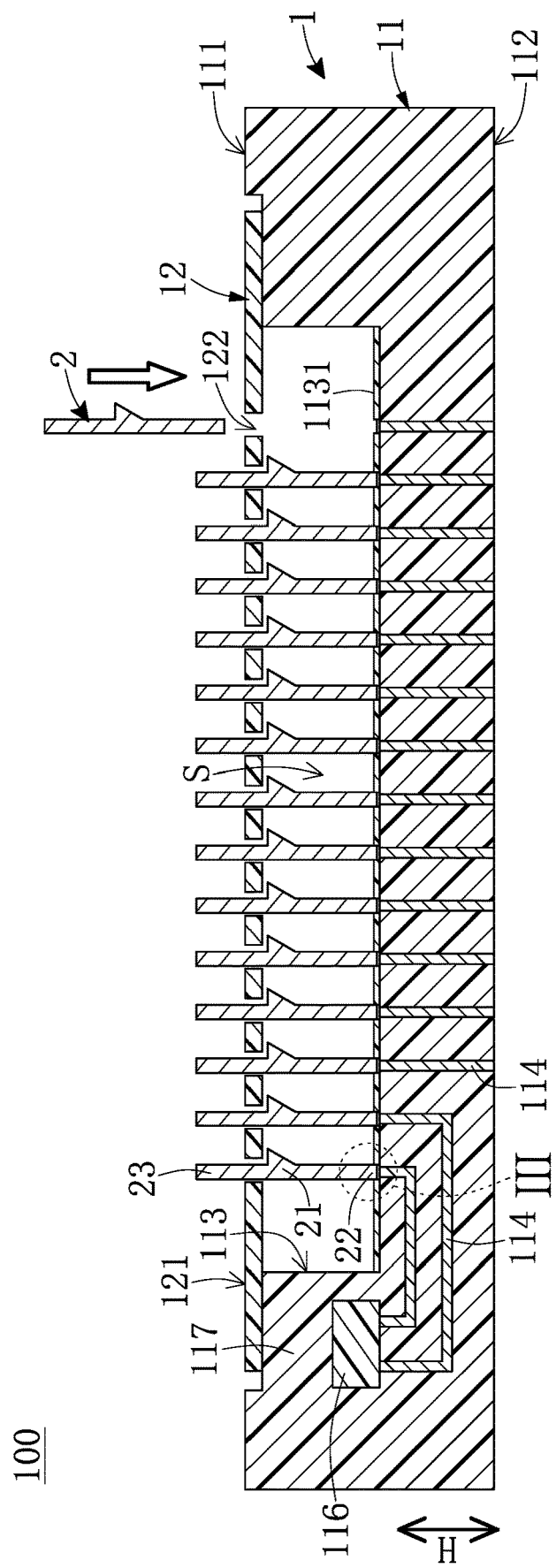
FIG. 2 is a schematic view showing the flat signal transfer structure of FIG. 1A to be inserted with conductive probes.

As shown in FIG. 1A and FIG. 2, the transfer plate 11 of the present embodiment is a substantially flat structure, and has a first surface 111 and a second surface 112 that is opposite to the first surface 111. Specifically, the transfer plate 11 is preferably a multi-layer board, but the present disclosure is not limited thereto.

Figure 6:
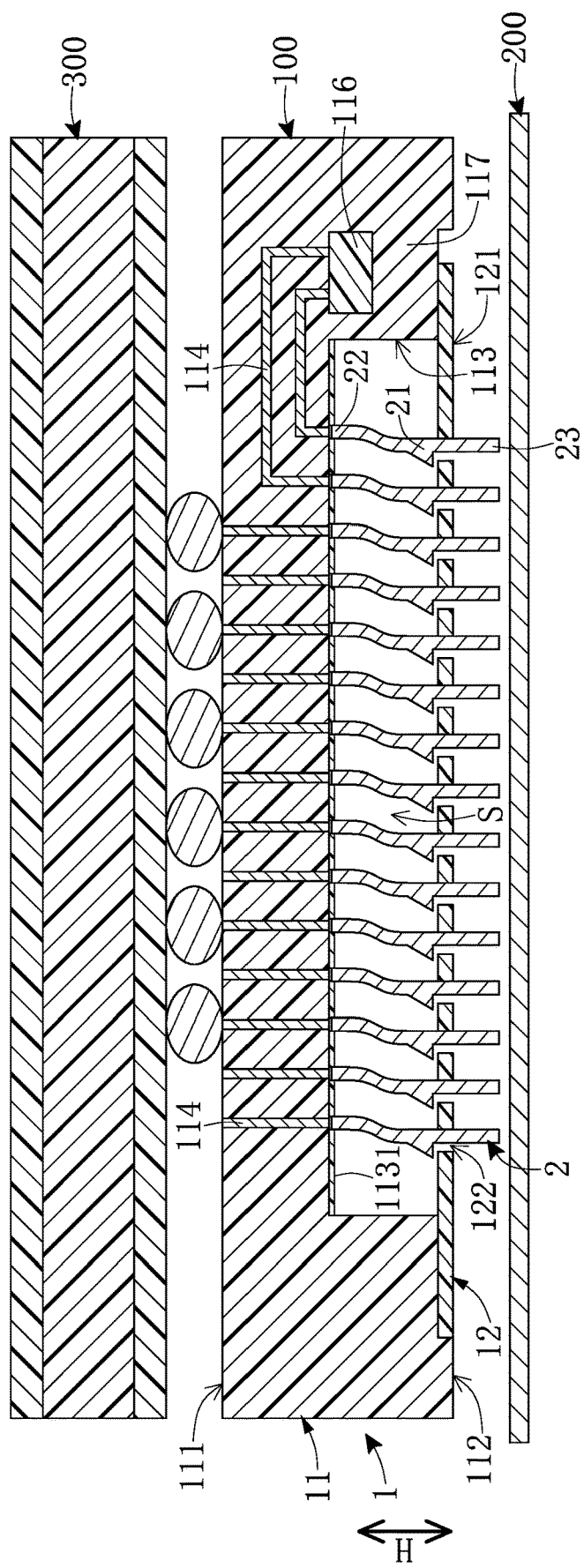
FIG. 6 is a schematic view showing the probe card device of FIG. 5A that is fixed on a circuit board for detecting an object.

The transfer plate 11 includes a receiving slot 113 recessed from the first surface 111 and a plurality of signal circuits 114 each having a signal contact 1141 arranged on a bottom 1131 of the receiving slot 113, and the signal contacts 1141 of the transfer plate 11 are arranged in the receiving slot 113. Moreover, the second surface 112 of the transfer plate 11 is used for being fastened to a circuit board 300 (as shown in FIG. 6).

Figure 4:
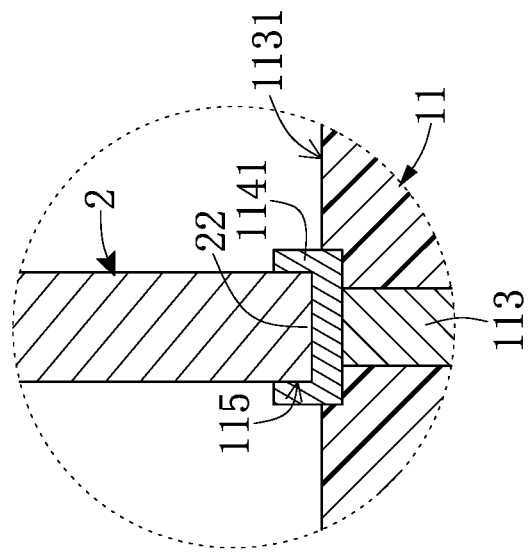
FIG. 4 is an enlarged view showing the portion III of FIG. 2 in another configuration.
Figure 3:
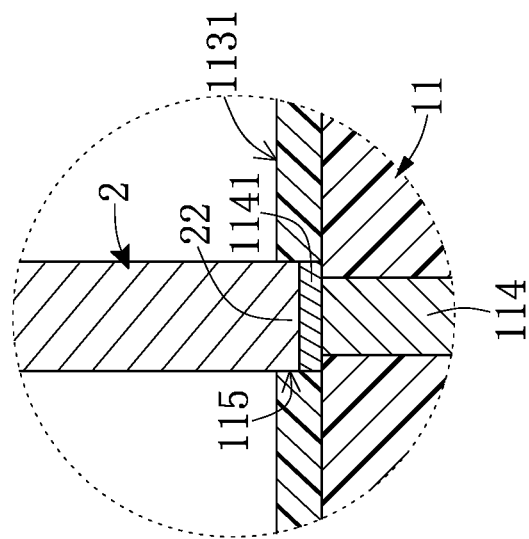
FIG. 3 is an enlarged view showing a portion III of FIG. 2.

Specifically, as shown in FIG. 2 to FIG. 4, the transfer plate 11 has a plurality of recesses 115 respectively arranged at each of the signal contacts 1141 on the bottom 1131 of the receiving slot 113. The recess 115 in the present embodiment can be formed by the signal contact 1141 and an adjacent portion of the transfer plate 11 (as shown in FIG. 3), or can be formed only by the signal contact 1141 (as shown in FIG. 4), but the present disclosure is not limited thereto.

Figure 5A:
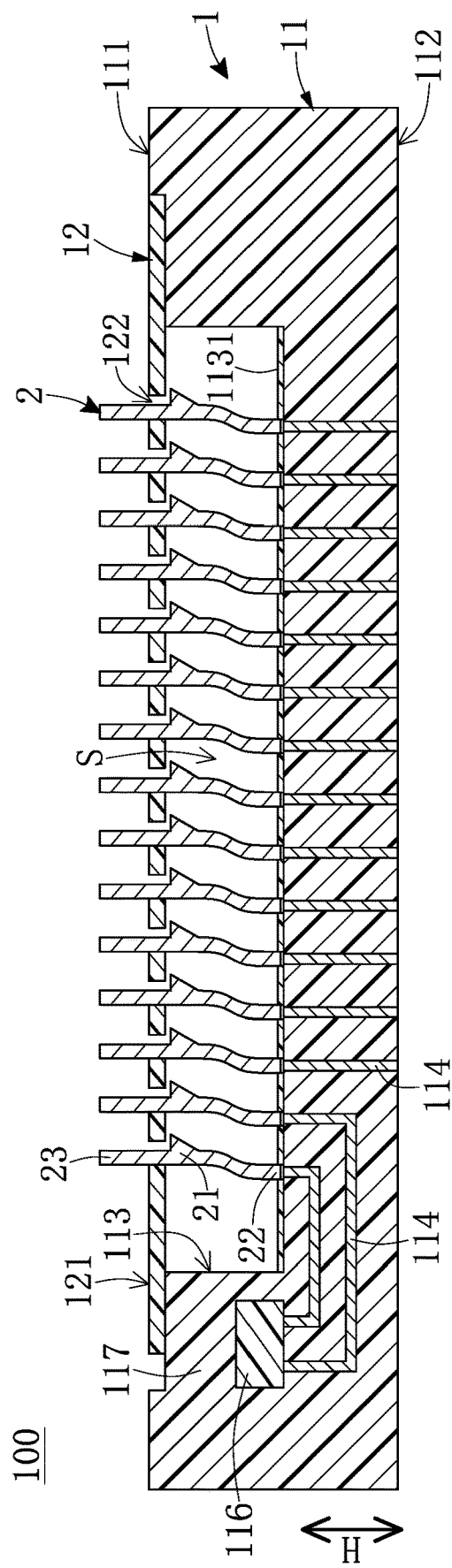
FIG. 5A is a schematic view of a probe card device according to the first embodiment of the present disclosure.
Figure 5B:
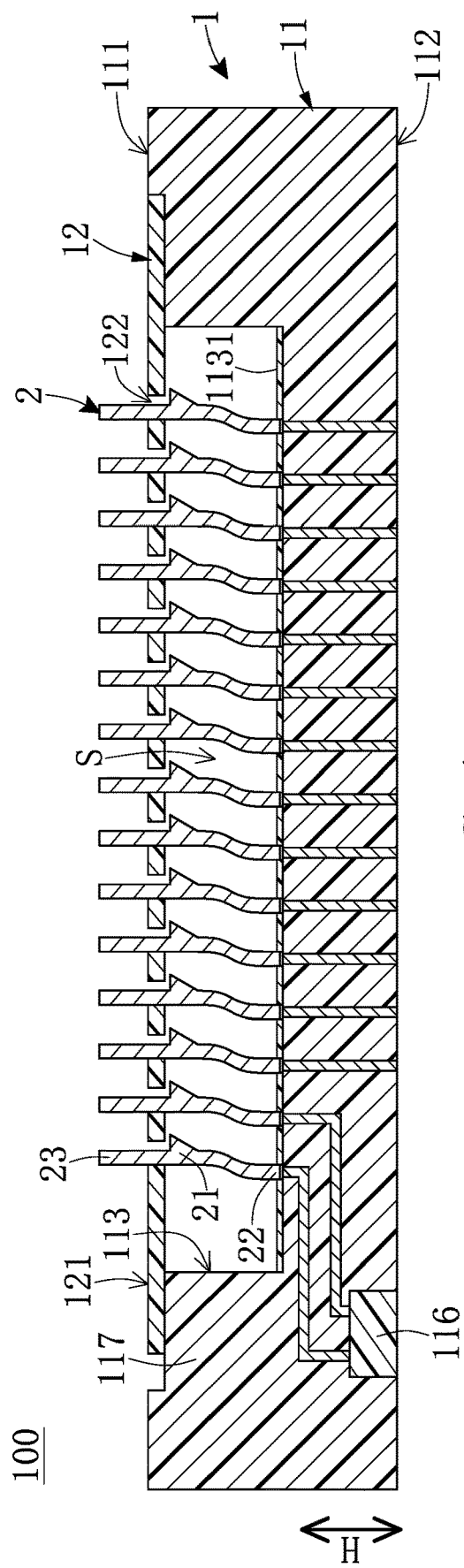
FIG. 5B is a schematic view of the probe card device according to the first embodiment of the present disclosure in another configuration.

In addition, the transfer plate 11 includes an impedance matching circuit 116 embedded therein, and the impedance matching circuit 116 is electrically coupled to at least part of the signal circuits 114. As shown in FIG. 5A of the present embodiment, a portion of the transfer plate 11 arranged around and adjacent to the receiving slot 113 is defined as a supporting portion 117. The impedance matching circuit 116 is embedded in the supporting portion 117, and is arranged adjacent to the conductive probes 2, but the present disclosure is not limited thereto. For example, as shown in FIG. 5B, the impedance matching circuit 116 can be embedded in a portion of the transfer plate 11 other than the supporting portion 117. Accordingly, the impedance matching circuit 116 is embedded in the transfer plate 11 (e.g., the supporting portion 117) for reducing an electrical path between the impedance matching circuit 116 and the signal contacts 1141 of the corresponding signal circuits 114.

It should be noted that the supporting portion 117 is in an annular shape (e.g., a rectangular or square ring-shape), and is preferably a part of the transfer plate 11. In other words, the supporting portion 117 is preferably not an independent component that is additionally installed on (e.g., screwed on, wedged in, or adhered to) the transfer plate 11, but the present disclosure is not limited thereto. For example, in other embodiments of the present disclosure, the transfer plate 11 can be formed with a concave, and a supporting frame is disposed in the concave, so that an inner surface of the supporting frame and a bottom of the concave jointly define the receiving slot 113, and the supporting frame can be defined as the supporting portion 117.

As shown in FIG. 1A and FIG. 2, the retaining cover 12 in the present embodiment is in a flat shape, and is disposed on the supporting portion 117 of the transfer plate 11. An outer surface 121 of the retaining cover 12 is preferably coplanar with the first surface 111 of the transfer plate 11, but the present disclosure is not limited thereto. For example, the outer surface 121 of the retaining cover 12 can be lower than the first surface 111 of the transfer plate 11 (as shown in FIG. 1B), or the outer surface 121 of the retaining cover 12 can be higher than the first surface 111 of the transfer plate 11 (as shown in FIG. 1C).

Specifically, the retaining cover 12 has a plurality of thru-holes 122. The thru-holes 122 are arranged around a portion of the retaining cover 12 abutted against the supporting portion 117. The retaining cover 12 and the receiving slot 113 of the transfer plate 11 jointly and surroundingly define a receiving space S, and the thru-holes 122 are in spatial communication with the receiving space S. Moreover, the receiving space S of the flat signal transfer structure 1 can be in spatial communication with an outer space just through the thru-holes 122, but the present disclosure is not limited thereto.

Moreover, the retaining cover 12 in the present embodiment is movable between a probe receiving position (as shown in FIG. 1A or FIG. 2) and a retaining position (as shown in FIG. 5A) along a staggered direction (parallel to the first surface 111) relative to the supporting portion 117. When the retaining cover 12 is at the probe receiving position or the retaining position, the retaining cover 12 can be fixed on the supporting portion 117 by screws (not shown) for being maintained at the probe receiving position or the retaining position. In addition, in other embodiments of the present disclosure, the retaining cover 12 can be fixed on the supporting portion 117 in other manners (e.g., a wedged manner) for being maintained at the probe receiving position or the retaining position.

As shown in FIG. 2 and FIG. 5A, each of the conductive probes 2 has an elastic segment 21, a detecting segment 22, and a connecting segment 23, the latter two of which are respectively arranged at two opposite sides of the elastic segment 21. It should be noted that the conductive probe 2 in the present embodiment is an elongated structure that is electrically conductive and structurally flexible, and the conductive probe 2 can be a rectangular probe, a round probe, or a probe in other shapes.

Moreover, the conductive probes 2 respectively pass though the thru-holes 122 of the retaining cover 12, the elastic segment 21 and the connecting segment 22 of each of the conductive probes 2 are arranged in the receiving space S (or the receiving slot 113), and the detecting segment 23 of each of the conductive probes 2 is exposed out of the receiving space S and protrudes from the first surface 111. In other words, the conductive probe 2 of the probe card device 100 in the present embodiment is configured so that only one end portion (i.e., the detecting segment 23) thereof is exposed from the flat signal transfer structure 1. Accordingly, any probe card provided with at least one probe with two opposite end portions being exposed cannot be regarded as the probe card device 100 of the present embodiment.

Specifically, the connecting segments 22 of the conductive probes 2 are respectively fixed on the signal contacts 1141 of the transfer plate 11, so that the impedance matching circuit 116 can be electrically coupled to at least part of the signal circuits 114 and the corresponding conductive probes 2.

In the present embodiment, the connecting segment 22 of each of the conductive probe 2 is inserted into and fixed to the recess 115 of the corresponding signal contact 1141, but the present disclosure is not limited thereto. For example, in other embodiments of the present disclosure, the connecting segment 22 of the conductive probe 2 can be formed with a recess, and the transfer plate 11 can be formed with a protrusion arranged on the signal contact 1141, and the recess of the connecting segment 22 can cooperate with the protrusion of the transfer plate 11 to maintain the electrical and structural connection there-between.

In addition, when the retaining cover 12 is at the probe receiving position (as shown in FIG. 2), the thru-holes 122 of the retaining cover 12 respectively correspond in position to the signal contacts 1141 along the height direction H for allowing part of the conductive probes 2 (e.g., the connecting segments 22 and elastic segments 21) to respectively pass through the thru-holes 122 and to respectively abut against the signal contacts 1141 by the connecting segments 22. Moreover, when the retaining cover 12 is at the retaining position (as shown in FIG. 5A), the elastic segment 21 of each of the conductive probes 2 is compressed (by the retaining cover 12) to be in a curved shape.

Specifically, when the retaining cover 12 is at the probe receiving position (as shown in FIG. 2), the relationship between the thru-holes 122 of the retaining cover 12 and the signal contacts 1141 of the transfer plate 11 in the present embodiment signifies that projecting regions defined by orthogonally projecting the signal contacts 1141 onto the retaining cover 12 along the height direction H are preferably respectively arranged in the thru-holes 122, but the present disclosure is not limited thereto.

In summary, the flat signal transfer structure 1 of the probe card device 100 in the present embodiment having only one retaining cover 12 and no conventional spacer is different from conventional probe cards, thereby effectively reducing manufacturing costs of the probe card device 100 and providing a new direction for development. Moreover, the flat signal transfer structure 1 of the probe card device 100 can cooperate with shorter conductive probes 2 so that the probe card device 100 can be used to transmit signals of higher frequency.

Second Embodiment

Figure 7:
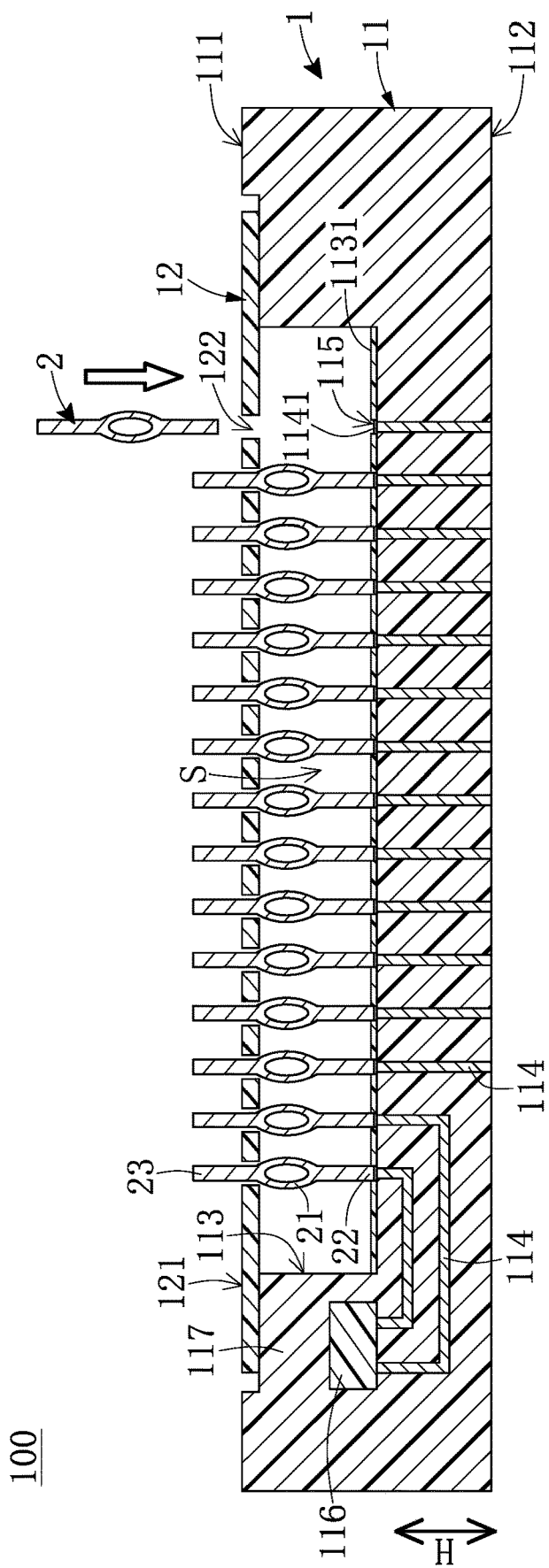
FIG. 7 is a schematic view showing a flat signal transfer structure to be inserted with probes according to a second embodiment of the present disclosure.

Referring to FIG. 7 to FIG. 9, a second embodiment of the present disclosure provides a probe card device 100. The present embodiment is similar to the first embodiment, and the difference between the embodiments is described as follows.

The retaining cover 12 in the present embodiment is directly fixed on the supporting portion 117, and the retaining cover 12 and the supporting portion 117 have only one relative position and cannot move relative to each other. The thru-holes 122 of the retaining cover 12 respectively correspond in position to the signal contacts 1141 along the height direction H. The elastic segment 21 of each of the conductive probes 2 is configured to pass through the corresponding thru-hole 122 by being elastically deformed, and the elastic segment 21 of each of the conductive probes 2 arranged in the receiving space S is configured to abut against the retaining cover 12 to be at a fixed position.

Specifically, the retaining cover 12 is formed without moving relative to the supporting portion 117 by the structural design of the conductive probes 2, so that the structure and the assembling process of the probe card device 100 can be simplified.

In conclusion, the flat signal transfer structure 1 of the probe card device 100 in the present embodiment having only one retaining cover 12 and no conventional spacer is different from conventional probe cards, thereby effectively reducing manufacturing costs of the probe card device 100 (e.g., by simplifying the structure and the assembling process of the probe card device 100) and providing a new direction for development. Moreover, the flat signal transfer structure 1 of the probe card device 100 can cooperate with the shorter conductive probes 2 so that the probe card device 100 can be used to transmit signals of higher frequency.

Moreover, since the flat signal transfer structure 1 of the present embodiment has a shape similar to a flat circuit board, the flat signal transfer structure 1 can be more conveniently transported or used to cooperate with other components. For example, when a large number of the flat signal transfer structures 1 are transported together, the flat signal transfer structures 1 can be stacked in one row so as to occupy minimum space.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   a flat signal transfer structure including:
   a transfer plate having a first surface and a second surface that is opposite to the first surface, wherein the transfer plate includes a receiving slot recessed from the first surface and a plurality of signal circuits each having a signal contact arranged on a bottom of the receiving slot, and a portion of the transfer plate arranged around and adjacent to the receiving slot is defined as a supporting portion; and
   a retaining cover having a plurality of thru-holes and disposed on the supporting portion, wherein the retaining cover and the receiving slot of the transfer plate jointly and surroundingly define a receiving space; and
   a plurality of conductive probes each having an elastic segment, a detecting segment, and a connecting segment, the latter two of which are respectively arranged at two opposite sides of the elastic segment, wherein the conductive probes respectively pass though the thru-holes of the retaining cover, the elastic segment and the connecting segment of each of the conductive probes are arranged in the receiving space, and the detecting segment of each of the conductive probes is exposed out of the receiving space and protrudes from the first surface, and wherein the connecting segments of the conductive probes are respectively fixed on the signal contacts of the transfer plate,
   wherein the transfer plate includes an impedance matching circuit embedded therein, and the impedance matching circuit is electrically coupled to at least part of the signal circuits and the corresponding conductive probes,
   wherein the impedance matching circuit is embedded in the supporting portion and is arranged adjacent to the conductive probes.

2. The probe card device according to claim 1, wherein the transfer plate is a multi-layer board, and an outer surface of the retaining cover is substantially coplanar with the first surface of the transfer plate.

3. The probe card device according to claim 1, wherein the retaining cover is movable between a probe receiving position and a retaining position relative to the supporting portion; when the retaining cover is at the probe receiving position, the thru-holes of the retaining cover respectively correspond in position to the signal contacts along a height direction for allowing the conductive probes to respectively pass through the thru-holes and to respectively abut against the signal contacts; when the retaining cover is at the retaining position, the elastic segment of each of the conductive probes is compressed to be in a curved shape.

4. The probe card device according to claim 1, wherein the retaining cover is fixed on the supporting portion, the thru-holes of the retaining cover respectively correspond in position to the signal contacts along a height direction, the elastic segment of each of the conductive probes is configured to pass through the corresponding thru-hole by being elastically deformed, and the elastic segment of each of the conductive probes arranged in the receiving space is configured to abut against the retaining cover to be at a fixed position.

5. The probe card device according to claim 1, wherein the transfer plate has a plurality of recesses respectively arranged on the signal contacts on the bottom of the receiving slot, and each of the conductive probe is inserted into and fixed to the recess of the corresponding signal contact.

6. A probe card device, comprising:
   a flat signal transfer structure including:
   a transfer plate having a first surface and a second surface that is opposite to the first surface, wherein the transfer plate includes a receiving slot recessed from the first surface and a plurality of signal circuits each having a signal contact arranged on a bottom of the receiving slot, and a portion of the transfer plate arranged around and adjacent to the receiving slot is defined as a supporting portion; and
   a retaining cover having a plurality of thru-holes and disposed on the supporting portion, wherein the retaining cover and the receiving slot of the transfer plate jointly and surroundingly define a receiving space; and
   a plurality of conductive probes each having an elastic segment, a detecting segment, and a connecting segment, the latter two of which are respectively arranged at two opposite sides of the elastic segment, wherein the conductive probes respectively pass though the thru-holes of the retaining cover, the elastic segment and the connecting segment of each of the conductive probes are arranged in the receiving space, and the detecting segment of each of the conductive probes is exposed out of the receiving space and protrudes from the first surface, and wherein the connecting segments of the conductive probes are respectively fixed on the signal contacts of the transfer plate,
   wherein the retaining cover is movable between a probe receiving position and a retaining position relative to the supporting portion; when the retaining cover is at the probe receiving position, the thru-holes of the retaining cover respectively correspond in position to the signal contacts along a height direction for allowing the conductive probes to respectively pass through the thru-holes and to respectively abut against the signal contacts; when the retaining cover is at the retaining position, the elastic segment of each of the conductive probes is compressed to be in a curved shape.

* * * * *